(12) United States Patent
Yang

(10) Patent No.: US 7,821,867 B2
(45) Date of Patent: Oct. 26, 2010

(54) SEMICONDUCTOR MEMORY DEVICE

(75) Inventor: Sun-Suk Yang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 84 days.

(21) Appl. No.: 12/344,654

(22) Filed: Dec. 29, 2008

(65) Prior Publication Data
US 2010/0110805 A1    May 6, 2010

(30) Foreign Application Priority Data
Nov. 6, 2008    (KR) .................... 10-2008-0110092

(51) Int. Cl.
G11C 8/00    (2006.01)
(52) U.S. Cl. ................ 365/230.06; 365/230.03; 365/189.05; 365/233.1
(58) Field of Classification Search ............ 365/230.06, 365/230.03, 189.05, 233.1, 220, 230.01
See application file for complete search history.

(56) References Cited

U.S. PATENT DOCUMENTS 7,161,870 B2 *   1/2007   Zitlaw et al. ........... 365/230.06

FOREIGN PATENT DOCUMENTS

JP    2008-021364    1/2008

OTHER PUBLICATIONS

Notice of Allowance issued from Korean Intellectual Property Office on May 31, 2010.

* cited by examiner

*Primary Examiner*—David Lam
(74) *Attorney, Agent, or Firm*—IP & T Law Firm PLC

(57) ABSTRACT

A semiconductor memory device includes a plurality of address pads, a plurality of data pads, a mode entry controlling unit configured to control the entry to a data masking mode in response to a write command signal and signals inputted through predetermined pads among the plurality of address pads, a signal classifying unit configured to classify signals inputted sequentially and in parallel through the plurality of address pads into column address signals and data masking signals in response to an output signal of the mode entry controlling unit and a write latency signal, and a pad masking signal generating unit configured to generate pad masking signals to control the masking of data inputted through the plurality of data pads, where the pad masking signals are generated by converting the data masking signals in response to the output signal of the mode entry controlling unit.

11 Claims, 7 Drawing Sheets

SEMICONDUCTOR MEMORY DEVICE

CROSS-REFERENCE TO RELATED APPLICATIONS

The present invention claims priority of Korean patent application number 10-2008-0110092, filed on Nov. 6, 2008, respectively, which is incorporated by reference in its entirety.

BACKGROUND OF THE INVENTION

The present invention relates to semiconductor design technology, and more particularly, to a semiconductor memory device performing a data masking operation by receiving a data masking signal through a pad, wherein an address signal is inputted through the pad.

Nowadays, various electronic instruments are being developed into satisfying needs for a high speed operation, miniaturization, low power consumption and low price, and thus a semiconductor memory device is also being developed into a direction of achieving the high speed operation, the high integration and the low power consumption. As part of the high speed operation and the low power consumption, there is a data masking operation. Data masking operation means "sorting out data." Therefore, by masking the progress of some of unnecessary data in a reading or writing operation through the data masking operation, it is possible to prevent undesired current consumption as well as achieve more rapid data input/output, so that the semiconductor memory device can operate at a high speed.

FIG. 1 illustrates a block diagram for explaining a data masking operation in a conventional semiconductor memory device.

As shown, the conventional semiconductor memory device includes a plurality of banks BANK 0, BANK 1, BANK 2, and BANK 3, each of which has a plurality of cells, a plurality of data pads DQ PAD<0:31> for receiving data signals DATA<0:31> having a plurality of bits, a plurality of address pads ADDRESS PAD<0:11> and BANK ADDRESS PAD<0:3> for receiving address signals ADDRESS<0:11> having a plurality of bits and bank address signals BANK ADDRSSS<0:3>, a plurality of data masking pads DM PAD 0, DM PAD 1, DM PAD 2, and DM PAD 3 for receiving a plurality of data masking signals DATA_MSK0, DATA_MSK1, DATA_MSK2, and DATA_MSK3, and an address decoder for decoding the address signals ADDRESS<0:11> and the bank address signals BANK ADDRESS<0:3> inputted through the plurality of address pads ADDRESS PAD<0:11> and BANK ADDRESS PAD<0:3> and transferring the decoded signals to the plurality of banks BANK 0, BANK 1, BANK 2, and BANK 3.

In order to perform the data masking operation, the conventional semiconductor memory device separately includes the plurality of data masking pads DM PAD 0, DM PAD 1, DM PAD 2, and DM PAD 3 and receives the plurality of data masking signals DATA_MSK0, DATA_MSK1, DATA_MSK2, and DATA_MSK3 through the plurality of data masking pads DM PAD 0, DM PAD 1, DM PAD 2, and DM PAD 3. Hereinafter, the operation of receiving the plurality of data masking signals DATA_MSK0, DATA_MSK1, DATA_MSK2, and DATA_MSK3 will be described.

If the data masking operation is not performed, all of the plurality of data masking signals DATA_MSK0, DATA_MSK1, DATA_MSK2, and DATA_MSK3 inputted through the plurality of data masking pads DM PAD 0, DM PAD 1, DM PAD 2, and DM PAD 3 are disabled.

Therefore, the plurality of data signals DATA<0:31> corresponding to the plurality of data pads DQ PAD<0:31> may be freely inputted/outputted to/from cells that are selected from the plurality of cells included in each of the plurality of banks BANK 0, BANK 1, BANK 2, and BANK 3 in response to row address signals ROW ADDRESS<0:11> and column address signals COLUMN ADDRESS<0:6> outputted from the address decoder.

On the other hand, if the data masking operation is performed, the $0^{th}$ masking signal DATA_MSK0 and the first data masking signal DATA_MSK1 among the plurality of data masking signals DATA_MSK0, DATA_MSK1, DATA_MSK2, and DATA_MSK3 inputted through the plurality of data masking pads DM PAD 0, DM PAD 1, DM PAD 2, and DM PAD 3 may be enabled, whereas the second data masking signal DATA_MSK2 and the third masking signal DATA_MSK3 may be disabled.

Therefore, although a certain cell is selected from the plurality of cells included in each of the banks BANK 0, BANK 1, BANK 2, and BANK 3 in response to the row address signals ROW ADDRESS<0:11> and the column address signals COLUMN ADDRESS<0:6> outputted from the address decoder, the data signals DATA<0:15> cannot be freely inputted/outputted to/from the cells that are selected from the $0^{th}$ bank BANK 0 and the first bank BANK 1 corresponding to the enabled $0^{th}$ data masking signal DATA_MSK0 and the enabled first data masking signal DATA_MSK1, respectively, whereas the data signals DATA<16:31> can be freely inputted/outputted to/from the cells that are selected from the second bank BANK 2 and the third bank BANK 3 in response to the disabled second data masking signal DATA_MSK2 and the disabled third data masking signal DATA_MSK3, respectively.

That is, since the $0^{th}$ to the $15^{th}$ data signals DATA<0:15> corresponding to the $0^{th}$ to the $15^{th}$ data pads DQ PAD<0:15> among the plurality of data pads DQ PAD<0:31> cannot be inputted/outputted by the enabled $0^{th}$ data masking signal DATA_MSK0 and the enabled first data masking signal DATA_MSK1, the $0^{th}$ to $15^{th}$ data signals DATA<0:15> cannot be transferred from the external to the $0^{th}$ bank BANK 0 and the first bank BANK 1 and the $0^{th}$ to $15^{th}$ data signals DATA<0:15> stored in the $0^{th}$ bank BANK 0 and the first bank BANK 1 cannot be outputted to the external.

Meanwhile, since the $16^{th}$ to the $31^{st}$ data signals DATA<16:31> corresponding to the $16^{th}$ to the $31^{st}$ data pads DQ PAD<16:31> among the plurality of data pads DQ PAD<0:31> can be inputted/outputted by the disabled second data masking signal DATA_MSK2 and the disabled third data masking signal DATA_MSK3, the $16^{th}$ to $31^{st}$ data signals DATA<16:31> can be transferred from the external to the second bank BANK 2 and the third bank BANK 3 and the $16^{th}$ to $31^{st}$ data signals DATA<16:31> stored in the second bank BANK 2 and the third bank BANK 3 can be outputted to the external.

As described above, the conventional semiconductor memory device properly adjusts enablement/disablement of the plurality of data masking signals DATA_MSK0, DATA_MSK1, DATA_MSK2, and DATA_MSK3 to sort out data pads to be masked or data pads not to be masked.

For instance, the conventional semiconductor memory device employs a scheme of allowing one data masking signal to mask one byte of data signals, i.e., 8 data signals. In another example, the conventional semiconductor memory device may employ a scheme of allowing one data masking signal to mask data signals whose number is greater or smaller than one byte.

If performing the data masking operation by directly receiving the plurality of data masking signals DATA_MSK0, DATA_MSK1, DATA_MSK2, and DATA_MSK3 from the external such as in the conventional semiconductor device, the data masking operation can be simply performed. However, in that case, there is a problem of necessarily requiring the plurality of data masking pads DM PAD 0, DM PAD 1, DM PAD 2, and DM PAD 3 to receive the plurality of data masking signals DATA_MSK0, DATA_MSK1, DATA_MSK2, and DATA_MSK3 from the external.

SUMMARY OF THE INVENTION

Embodiments of the present invention are directed to provide a semiconductor memory device capable of performing a data masking operation by receiving data masking signals together with address signals through pads where the address signals are inputted.

In accordance with an aspect of the present invention, there is provided a semiconductor device including: a plurality of address pads; a plurality of data pads; a mode entry controlling unit configured to control the entry to a data masking mode in response to a write command signal and signals inputted through predetermined pads among the plurality of address pads; a signal classifying unit configured to classify signals inputted sequentially and in parallel through the plurality of address pads into column address signals and data masking signals in response to an output signal of the mode entry controlling unit and a write latency signal; and a pad masking signal generating unit configured to generate pad masking signals to control the masking of data inputted through the plurality of data pads, where the pad masking signals are generated by converting the data masking signals in response to the output signal of the mode entry controlling unit.

DESCRIPTION OF SPECIFIC EMBODIMENTS

Other objects and advantages of the present invention can be understood by the following description, and become apparent with reference to the embodiments of the present invention.

Figure 1:
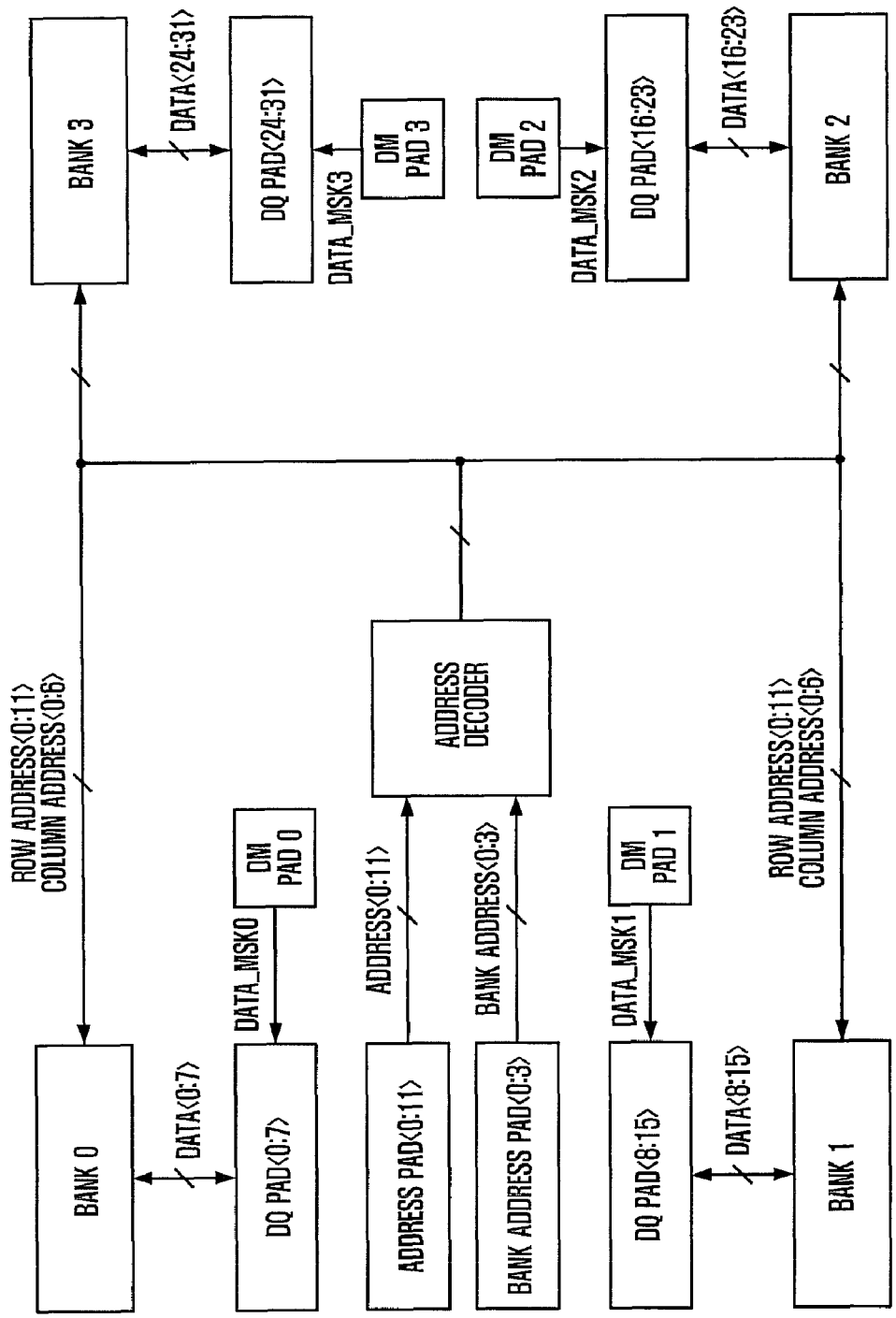
FIG. 1 illustrates a block diagram for explaining a data masking operation in a conventional semiconductor memory device.
Figure 2:
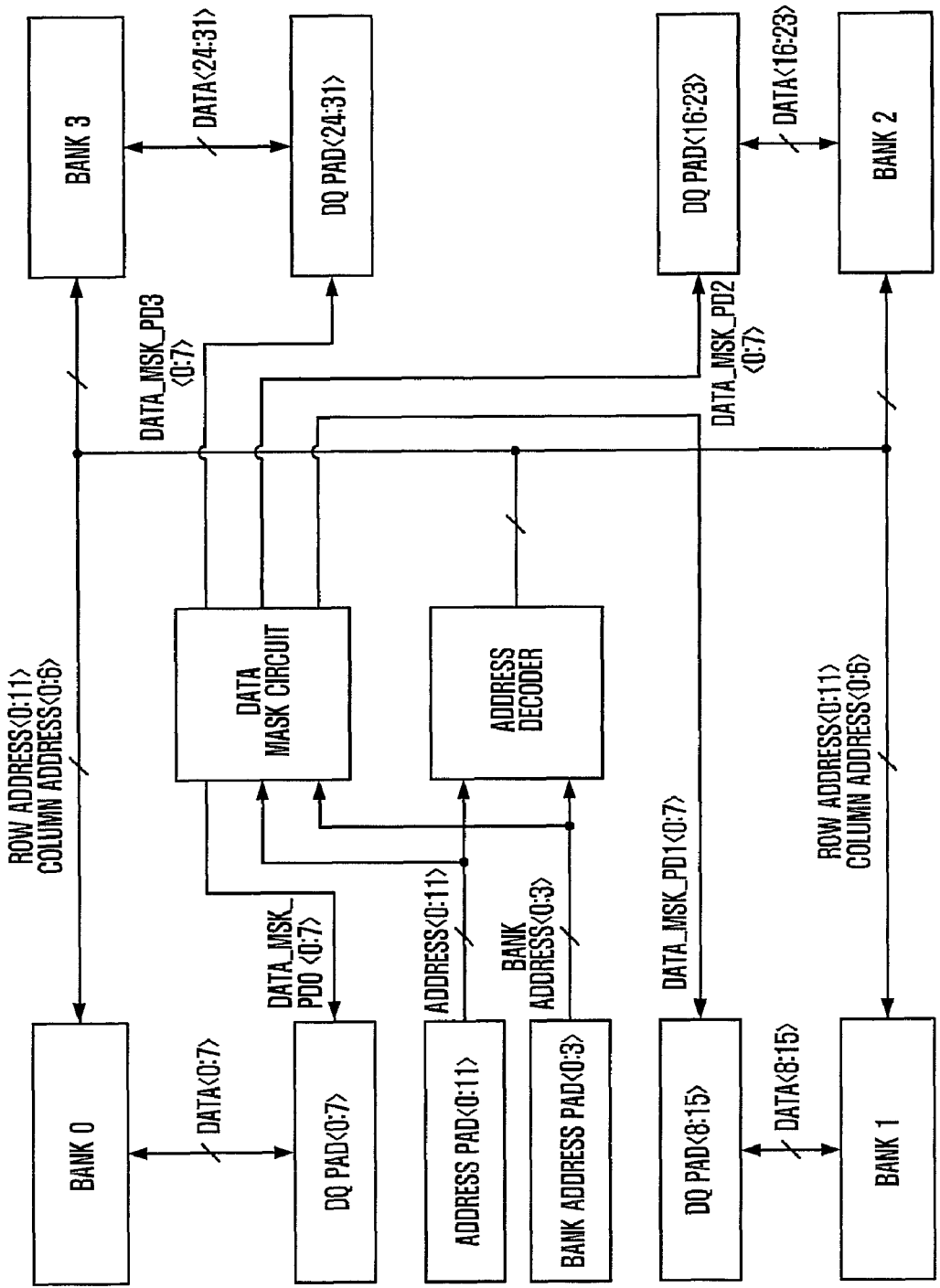
FIG. 2 illustrates a block diagram for explaining a data masking operation in a semiconductor memory device in accordance with an embodiment of the present invention.

FIG. 2 illustrates a block diagram for explaining a data masking operation in a semiconductor memory device in accordance with an embodiment of the present invention.

As shown, the semiconductor memory device in accordance with an embodiment of the present invention includes a plurality of banks BANK 0, BANK 1, BANK 2, and BANK 3 each of which has a plurality of cells, a plurality of data pads DQ PAD<0:31> for receiving data signals DATA<0:31> having a plurality of bits, a plurality of address pads ADDRESS PAD<0:11> and BANK ADDRESS PAD<0:3> for receiving address signals ADDRESS<0:11> having a plurality of bits and bank address signals BANK ADDRESS<0:3>, an address decoder for decoding the address signals ADDRESS<0:11> and the bank address signals BANK ADDRESS<0:3> inputted through the plurality of address pads ADDRESS PAD<0:11> and BANK ADDRESS PAD<0:3> and transferring the decoded signals to the plurality of banks BANK 0, BANK 1, BANK 2 and BANK 3, and a data mask circuit for generating a plurality of pad masking signals DATA_MSK_PD0<0:7>, DATA_MSK_PD1<0:7>, DATA_MSK_PD2<0:7>, and DATA_MSK_PD3<0:7> to control the masking of the data signals DATA<0:31> inputted/outputted through the plurality of data pads DQ PAD<0:31> in response to the address signals ADDRESS<0:11> and the bank address signals BANK ADDRESS<0:3> inputted through the plurality of address pads ADDRESS PAD<0:11> and BANK ADDRESS PAD<0:3>.

Since the plurality of banks BANK 0, BANK 1, BANK 2 and BANK 3 each of which includes the plurality of cells directly store the plurality of data signals DATA<0:31> in the plurality of cells therein, the banks may be referred to as a core range. Although it is not shown in figures, a circuit configured to perform an input/output operation of the plurality of data signals DATA<0:31> for cells selected from the plurality of banks BANK 0, BANK 1, BANK 2, and BANK 3 in response to row address signals ROW ADDRESS<0:11> and column address signals COLUMN ADDRESS<0:6> among the plurality of cells included in the banks BANK 0, BANK 1, BANK 2, and BANK 3 may be referred to as a peripheral range.

As described above, unlike the conventional semiconductor device, the semiconductor memory device in accordance with the embodiment of the present invention employs a scheme of generating the plurality of pad masking signals DATA_MSK_PD0<0:7>, DATA_MSK_PD1<0:7>, DATA_MSK_PD2<0:7>, and DATA_MSK_PD3<0:7> using the address signals ADDRESS<0:11> and the bank address signals BANK ADDRESS<0:3> inputted through the plurality of address pads ADDRESS PAD<0:11> and BANK ADDRESS PAD<0:3> instead of separately including a plurality of data masking pads DM PAD 0, DM PAD 1, DM PAD 2 and DM PAD 3 in order to perform the data masking operation. Hereinafter, the inventive data masking operation will be described.

In case that the data masking operation is not performed, although the address signals ADDRESS<0:11> and the bank address signals BANK ADDRESS<0:3> are inputted through the plurality of address pads ADDRESS PAD<0:11> and BANK ADDRESS PAD<0:3>, the data mask circuit does not generate the plurality of pad masking signals DATA_MSK_PD0<0:7>, DATA_MSK_PD1<0:7>, DATA_MSK_PD2<0:7>, and DATA_MSK_PD3<0:7> or generates all of the pad masking signals DATA_MSK_PD0<0:7>, DATA_MSK_PD1<0:7>, DATA_MSK_PD2<0:7>, and DATA_MSK_PD3<0:7> in a disabled state. That is, the address signals ADDRESS<0:11> and the bank address signals BANK ADDRESS<0:3> inputted through the plurality of address pads ADDRESS PAD<0:11> and BANK ADDRESS PAD<0:3> are used only for generating the row address signals ROW ADDRESS<0:11> and the column address signals COLUMN ADDRESS<0:6> through the address decoder.

Therefore, the plurality of data signals DATA<0:31> corresponding to the plurality of data pads DQ PAD<0:31> may be freely inputted/outputted to/from cells that are selected from the plurality of cells included in the plurality of banks BANK 0, BANK 1, BANK 2, and BANK 3 in response to the row address signals ROW ADDRESS<0:11> and the column address signals COLUMN ADDRESS<0:6> outputted from the address decoder.

On the other hand, in case that the data masking operation is performed, the address signals ADDRESS<0:11> and the bank address signals BANK ADDRESS<0:3> inputted through the plurality of address pads ADDRESS PAD<0:11> and BANK ADDRESS PAD<0:3> may be inputted to the address decoder and used to generate the row address signals ROW ADDRESS<0:11> and the column address signals COLUMN ADDRESS<0:6> according to their input timing, and may be inputted to the data mask circuit and used to generate the plurality of pad masking signals DATA_MSK_PD0<0:7>, DATA_MSK_PD1<0:7>, DATA_MSK_PD2<0:7> and DATA_MSK_PD3<0:7>.

At this time, if $0^{th}$ pad masking signals DATA_MSK_PD0<0:7> and first pad masking signals DATA_MSK_PD1<0:7> are generated in an enabled state and the second pad masking signals DATA_MSK_PD2<0:7> and the third pad masking signals DATA_MSK_PD3<0:7> are generated in a disabled state among the plurality of pad masking signals DATA_MSK_PD0<0:7>, DATA_MSK_PD1<0:7>, DATA_MSK_PD2<0:7>, and DATA_MSK_PD3<0:7> generated in the data mask circuit, although a certain cell is selected from the plurality of cells included in each of the banks BANK 0, BANK 1, BANK 2, and BANK 3 in response to the row address signals ROW ADDRESS<0:11> and the column address signals COLUMN ADDRESS<0:6> outputted from the address decoder, the data signals DATA<0:15> cannot be freely inputted/outputted to/from the cells that are selected from the $0^{th}$ bank BANK 0 and the first bank BANK 1 corresponding to the enabled $0^{th}$ pad masking signals DATA_MSK_PD0<0:7> and the enabled first pad masking signals DATA_MSK_PD1<0:7>, respectively, whereas the data signals DATA<16:31> can be freely inputted/outputted to/from the cells that are selected from the second bank BANK 2 and the third bank BANK 3 in response to the disabled second pad masking signals DATA_MSK_PD2<0:7> and the disabled third pad masking signals DATA_MSK_PD3<0:7>, respectively.

That is, since the $0^{th}$ to the $15^{th}$ data signals DATA<0:15> corresponding to the $0^{th}$ to the $15^{th}$ data pads DQ PAD<0:15> among the plurality of data pads DQ PAD<0:31> cannot be inputted/outputted by the enabled $0^{th}$ pad masking signals DATA_MSK_PD0<0:7> and the enabled first pad masking signals DATA_MSK_PD1<0:7>, the $0^{th}$ to $15^{th}$ data signals DATA<0:15> cannot be transferred from the external to the $0^{th}$ bank BANK 0 and the first bank BANK 1 and the $0^{th}$ to $15^{th}$ data signals DATA<0:15> stored in the $0^{th}$ bank BANK 0 and the first bank BANK 1 cannot be outputted to the external.

Meanwhile, since the $16^{th}$ to the $31^{st}$ data signals DATA<16:31> corresponding to the $16^{th}$ to the $31^{st}$ data pads DQ PAD<16:31> among the plurality of data pads DQ PAD<0:31> can be inputted/outputted by the disabled second pad masking signals DATA_MSK_PD2<0:7> and the disabled third pad masking signals DATA_MSK_PD3<0:7>, the $16^{th}$ to $31^{st}$ data signals DATA<16:31> can be transferred from the external to the second bank BANK 2 and the third bank BANK 3 and the $16^{th}$ to $31^{st}$ data signals DATA<16:31> stored in the second bank BANK 2 and the third bank BANK 3 can be outputted to the external.

While, in the prior art, each of the data masking signals DATA_MSK0, DATA_MSK1, DATA_MSK2 and DATA_MSK3 inputted through the data masking pads DM PAD 0, DM PAD 1, DM PAD 2 and DM PAD 3 is one bit signal, it is noted that each of the pad masking signals DATA_MSK_PD0<0:7>, DATA_MSK_PD1<0:7>, DATA_MSK_PD2<0:7>, and DATA_MSK_PD3<0:7> in accordance with this embodiment of the present invention includes a plurality of bits. That is, the number of signals to mask data in the prior art is different from that in this embodiment of the present invention since information for a burst operation should be added when masking data in this embodiment of the present invention.

In the prior art, since there exist the data masking pads DM PAD 0, DM PAD 1, DM PAD 2 and DM PAD 3 corresponding to the plurality of data pads DQ PAD<0:31> in a unit of 8 bits, the data masking signals DATA_MSK0, DATA_MSK1, DATA_MSK2 and DATA_MSK3 are repeatedly inputted as often as the data is inputted/outputted through the plurality of data pads DQ PAD<0:31>.

However, in this embodiment of the present invention, since data masking signals DATA_MASK_SIG<0:15> inputted through the plurality of address pads ADDRESS PAD<0:11> and BANK ADDRESS PAD<0:3> cannot be repeatedly inputted as many times as the data is inputted/outputted through the plurality of data pads DQ PAD<0:31>, once the data masking signals DATA_MASK_SIG<0:15> are inputted, data mask information for the times data is inputted/outputted through the plurality of data pads DQ PAD<0:31>, is included, i.e., information of the data burst operation for each of the plurality of data pads DQ PAD<0:31>, until the data masking signals DATA_MASK_SIG<0:15> are inputted again.

Figure 3:
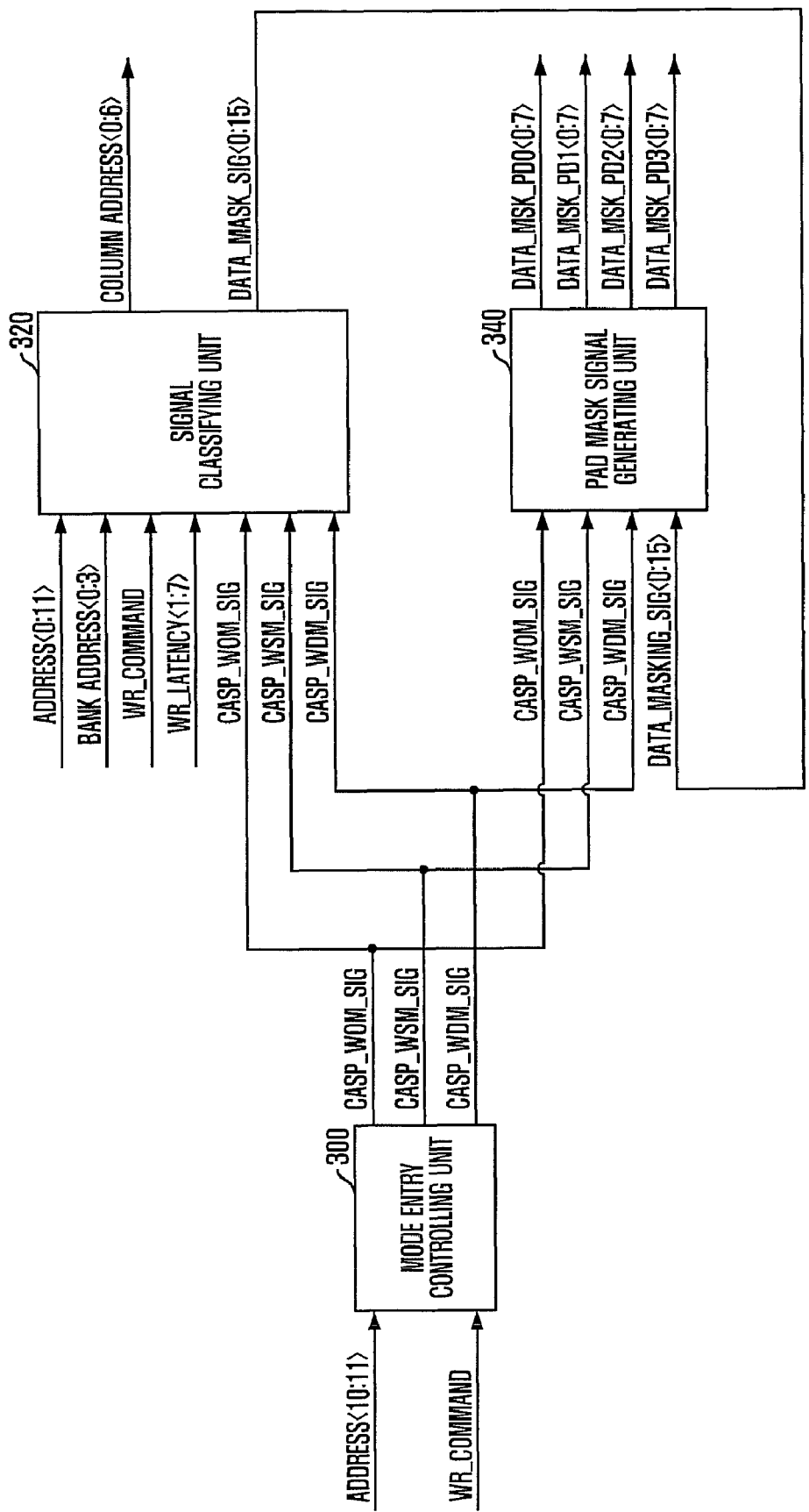
FIG. 3 illustrates a detailed block diagram of a data mask circuit used to perform the data masking operation in the semiconductor memory device described in FIG. 2.

FIG. 3 illustrates a detailed block diagram of the data mask circuit used to perform the data masking operation in the semiconductor memory device described in FIG. 2.

As shown, the data mask circuit includes a mode entry controlling unit 300, a signal classifying unit 320, and a pad masking signal generating unit 340.

The mode entry controlling unit 300 controls the entry to a data masking mode in response to a write command signal WR_COMMAND and address signals ADDRESS<10:11> inputted through predetermined pads ADDRESS PAD<10:11> among the plurality of address pads ADDRESS PAD<0:11> and BANK ADDRESS PAD<0:3>.

The signal classifying unit 320 classifies signals inputted sequentially and in parallel through the plurality of address pads ADDRESS PAD<0:11> and BANK ADDRESS PAD<0:3> into column address signals COLUMN ADDRESS<0:6> or data masking signals DATA_MASK_SIG<0:15> in response to write latency signals WR_LATENCY<1:7> and signals CASP_WOM_SIG, CASP_WDM_SIG and CASP_WSM_SIG outputted from the mode entry controlling unit 300.

The pad masking signal generating unit 340 generates the plurality of data masking signals DATA_MSK_PD0<0:7>, DATA_MSK_PD1<0:7>, DATA_MSK_PD2<0:7>, and DATA_MSK_PD3<0:7> to control the masking of the data signals DATA<0:31> inputted/outputted through the plurality of data pads DQ PAD<0:31>. Herein, the pad masking signal generating unit 340 generates the plurality of data masking signals DATA_MSK_PD0<0:7>, DATA_MSK_PD1<0:7>, DATA_MSK_PD2<0:7>, and DATA_MSK_PD3<0:7> by converting the data masking signals DATA_MSK_SIG<0:15> so that the data masking signals DATA_MSK_SIG<0:15> correspond to the signals CASP_WOM_SIG, CASP_WDM_SIG and CASP_WSM_SIG outputted from the mode entry controlling unit 300.

The mode entry controlling unit 300 generates a mode entry control signal. The mode entry control signals includes a data masking mode out signal CASP_WOM_SIG and data masking entry signals CASP_WDM_SIG and CASP_WDM_SIG. The mode entry controlling unit 300 outputs the enabled data masking mode out signal CASP_WOM_SIG when all of the address signals ADDRESS<10:11> inputted through the predetermined pads ADDRESS PAD<10:11> among the plurality of address pads ADDRESS PAD<0:11> and BANK ADDRESS PAD<0:3> are disabled in a period where the write command signal WR_COMMAND is enabled, thereby controlling the semiconductor memory device not to enter the data masking mode. Furthermore, the mode entry controlling unit 300 outputs the disabled data masking mode out signal CASP_WOM_SIG when one or more of the address signals ADDRESS<10:11> inputted through the predetermined pads ADDRESS PAD<10:11> among the plurality of address pads ADDRESS PAD<0:11> and BANK ADDRESS PAD<0:3> are enabled in the period where the write command signal WR_COMMAND is enabled, thereby controlling the semiconductor memory device to enter the data masking mode, and determines a type of the data masking mode by enabling any one of the plurality of data masking entry signals CASP_WDM_SIG and CASP_WSM_SIG according to the number of the enabled signals ADDRESS<10:11> inputted through the predetermined pads ADDRESS PAD<10:11> among the plurality of address pads ADDRESS PAD<0:11> and BANK ADDRESS PAD<0:3>, wherein the data masking entry signal CASP_WDM_SIG means a write-with-double byte-mask signal and the data masking entry signal CASP_WSM_SIG means a write-with-single byte-mask signal.

At this time, the reason why it is possible to control the entry to the data masking mode using the signals ADDRESS<10:11> inputted through the predetermined pads ADDRESS PAD<10:11> among the plurality of address pads ADDRESS PAD<0:11> and BANK ADDRESS PAD<0:3> is that the address signals inputted through the plurality of address pads ADDRESS PAD<0:11> and BANK ADDRESS PAD<0:3> are classified into the row address signals ROW ADDRESS<0:11> and the column address signals COLUMN ADDRESS<0:6> and the row address signals ROW ADDRESS<0:11> are inputted using all of the plurality of address pads ADDRESS PAD<0:11> and BANK ADDRESS PAD<0:3> while the column address signals COLUMN ADDRESS<0:6> are inputted using only some address pads ADDRESS PAD<0:6> and BANK ADDRESS PAD<0:3> among the plurality of address pads ADDRESS PAD<0:11> and BANK ADDRESS PAD<0:3>.

Namely, if the write command signal WR_COMMAND is enabled and the timing of receiving the column address signals COLUMN ADDRESS<0:6> inputted through the plurality of address pads ADDRESS PAD<0:11> and BANK ADDRESS PAD<0:3> comes, remaining pads ADDRESS PAD<7:11> except for the address pads ADDRESS PAD<0:6> and BANK ADDRESS PAD<0:3> through which the column address signals COLUMN ADDRESS<0:6> are inputted can be used differently from the address pads ADDRESS PAD<0:6> and BANK ADDRESS PAD<0:3> and the mode entry controlling unit 300 controls the entry to the data masking mode in response to signals inputted through the predetermined pads ADDRESS<10:11> among the remaining pads ADDRESS PAD<7:11>.

For reference, if the address signals ADDRESS<0:11> and the bank address signals BANK ADDRESS<0:3> inputted through the plurality of address pads ADDRESS PAD<0:11> and BANK ADDRESS PAD<0:3> are outputted as the row address signals ROW ADDRESS<0:11> by the address decoder, the row address signals ROW ADDRESS<0:11> are decoded in response to the address signals ADDRESS<0:11> and it is determined that the row address signals ROW ADDRESS<0:11> are transferred to a bank among the plurality of banks BANK 0, BANK 1, BANK 2 and BANK 3 in response to the bank address signals BANK ADDRESS<0:3>.

Likewise, in case that the address signals ADDRESS<0:11> and the bank address signals BANK ADDRESS<0:3> inputted through the plurality of address pads ADDRESS PAD<0:11> and BANK ADDRESS PAD<0:3> are outputted as the column address signals COLUMN ADDRESS<0:6> by the address decoder, the column address signals COLUMN ADDRESS<0:6> are decoded in response to the address signals ADDRESS<0:6> among the address signals ADDRESS<0:11> and it is determined that the column address signals COLUMN ADDRESS<0:6> are transferred to a bank among the plurality of banks BANK 0, BANK 1, BANK 2 and BANK 3 in response to the bank address signals BANK ADDRESS<0:3>.

In case that the address signals ADDRESS<0:11> and the bank address signals BANK ADDRESS<0:3> inputted through the plurality of address pads ADDRESS PAD<0:11> and BANK ADDRESS PAD<0:3> are classified into the data masking signals DATA_MASK_SIG<0:15> by the signal classifying unit 320, all of the address signals ADDRESS<0:11> and the bank address signals BANK ADDRESS<0:3> are outputted as the data masking signals DATA_MASK_SIG<0:15> having 16 bits.

Although, in accordance with the embodiment of the present invention, it is described that the data masking entry signals are classified into the single data masking entry signal CASP_WSM_SIG and the double data masking entry signal CASP_WDM_SIG only for the simplicity of explanation. Thus, the data masking entry signals can be classified into a much larger number of signals.

If the enabled data masking mode out signal CASP_WOM_SIG is outputted from the mode entry controlling unit 300, the signal classifying unit 320 recognizes signals inputted sequentially and in parallel through the plurality of address pads ADDRESS PAD<0:11> and BANK ADDRESS PAD<0:3> as the column address signals COLUMN ADDRESS<0:6> in a first clock cycle CLK and CLK# of two clock cycles 2tck and as meaningless signals in a second clock cycle CLK and CLK# of the two clock cycles 2tck.

Herein, a point of time where the signals are inputted in parallel through the plurality of address pads ADDRESS PAD<0:11> and BANK ADDRESS PAD<0:3> and a point of time where the signal classifying unit 320 recognizes the column address signals COLUMN ADDRESS<0:6> or the meaningless signals and outputs them, they are changed according to the write latency signals WR_LATENCY<1:7>. This will be described again when explaining a detailed circuit of the signal classifying unit 320.

For reference, the signal classifying unit 320 recognizes the signals inputted sequentially and in parallel through the plurality of address pads ADDRESS PAD<0:11> and BANK ADDRESS PAD<0:3> on the basis of the two clock cycles 2tck means that, in a state of not entering the data masking mode, the signals inputted sequentially and in parallel through the plurality of address pads ADDRESS PAD<0:11> and BANK ADDRESS PAD<0:3> repeatedly become the column address signals COLUMN ADDRESS<0:6> and the meaningless signals for every two clock cycles 2tck.

The column address signals COLUMN ADDRESS<0:6> outputted from the signal classifying unit 320 are inputted to the address decoder and then transferred to the plurality of banks BANK 0, BANK 1, BANK 2 and BANK 3 that are a core range, whereas the meaningless signals are not outputted from the signal classifying unit 320, or although they are outputted from the signal classifying unit 320, they are controlled not to affect the determination of logic levels of the plurality of pad masking signals DATA_MSK_PD0<0:7>, DATA_MSK_PD1<0:7>, DATA_MSK_PD2<0:7> and DATA_MSK_PD3<0:7> generated by the pad masking signal generating unit 340.

That is, the pad masking signal generating unit 340 disables the plurality of pad masking signals DATA_MSK_PD0<0:7>, DATA_MSK_PD1<0:7>, DATA_MSK_PD2<0:7> and DATA_MSK_PD3<0:7> regardless of signals outputted from the signal classifying unit 320 in response to the enablement of the data masking mode output signal CASP_WOM_SIG, thereby making the data DATA<0:31> inputted/outputted through the plurality of data pads DQ PAD<0:31> not be masked.

If the enabled single data masking entry signal CASP_WSM_SIG of the data masking entry signals CASP_WDM_SIG and CASP_WSM_SIG is outputted from the mode entry controlling unit 300, the signal classifying unit 320 recognizes the signals inputted sequentially and in parallel through the plurality of address pads ADDRESS PAD<0:11> and BANK ADDRESS PAD<0:3> as the column address signals COLUMN ADDRESS<0:6> in a first clock cycle CLK and CLK# of three clock cycles 3tck, as first data masking signals DATA_MASK_SIG1<0:15> in a second clock cycle CLK and CLK# of the three clock cycles 3tck and as second data masking signals DATA_MASK_SIG2<0:15> in a third clock cycle CLK and CLK# of the three clock cycles 3tck.

Herein, a point of time where the signals are inputted in parallel through the plurality of address pads ADDRESS PAD<0:11> and BANK ADDRESS PAD<0:3> and a point of time where the signal classifying unit 320 recognizes and outputs the column address signals COLUMN ADDRESS<0:6>, the first data masking signals DATA_MASK_SIG1<0:15> or the second data masking signals DATA_MASK_SIG2<0:15> are changed according to the write latency signals WR_LATENCY<1:7>. This will be described again when explaining the detailed circuit of the signal classifying unit 320.

For reference, the signal classifying unit 320 recognizes the signals inputted sequentially and in parallel through the plurality of address pads ADDRESS PAD<0:11> and BANK ADDRESS PAD<0:3> on the basis of the three clock cycles 3tck means that, in a state of entering the data masking mode where the enabled single data masking entry signal CASP_WSM_SIG of the data masking entry signals CASP_WDM_SIG and CASP_WSM_SIG is inputted, the signals inputted sequentially and in parallel through the plurality of address pads ADDRESS PAD<0:11> and BANK ADDRESS PAD<0:3> repeatedly become the column address signals, COLUMN ADDRESS<0:6>, the first data masking signals DATA_MASK_SIG1<0:15> and the second data masking signals DATA_MASK_SIG2<0:15> for every three clock cycles 3tck.

While the column address signals COLUMN ADDRSS<0:6> are outputted from the signal classifying unit 320 and inputted to the address decoder to be transferred to the plurality of banks BANK 0, BANK 1, BANK 2 and BANK 3 that are the core range, the first data masking signals DATA_MASK_SIG1<0:15> and the second data masking signals DATA_MASK_SIG2<0:15> are inputted to the pad masking signal generating unit 340 and used to determine the logic levels of the plurality of pad masking signals DATA_MSK_PD0<0:7>, DATA_MSK_PD1<0:7>, DATA_MSK_PD2<0:7> and DATA_MSK_PD3<0:7>.

In particular, in response to the enabled single data masking entry signal CASP_WSM_SIG of the data masking entry signals CASP_WDM_SIG and CASP_WSM_SIG, the pad masking signal generating unit 340 coverts and outputs the first data masking signals DATA_MASK_SIG1<0:15> and the second data masking signals DATA_MASK_SIG2<0:15> to the first pad masking signals DATA_MSK_PD0<0:7> and DATA_MSK_PD2<0:7> and the second pad masking signals DATA_MSK_PD1<0:7> and DATA_MSK_PD3<0:7>, respectively.

That is, the data masking signals DATA_MASK_SIG1<0:3> and DATA_MASK_SIG1<8:11> among the first data masking signals DATA_MASK_SIG1<0:15> are used to determine the logic levels of the pad masking signals DATA_MSK_PD2<0:7> among the first pad masking signals DATA_MSK_PD0<0:7> and DATA_MSK_PD2<0:7>, and the data masking signals DATA_MASK_SIG1<4:7> and DATA_MASK_SIG1<12:15> among the first data masking signals DATA_MASK_SIG1<0:15> are used to determine the logic levels of the pad masking signals DATA_MSK_PD0<0:7> among the first pad masking signals DATA_MSK_PD0<0:7> and DATA_MSK_PD2<0:7>.

Likewise, the data masking signals DATA_MASK_SIG2<0:3> and DATA_MASK_SIG2<8:11> among the second data masking signals DATA_MASK_SIG2<0:15> are used to determine the logic levels of the pad masking signals DATA_MSK_PD1<0:7> among the second pad masking signals DATA_MSK_PD1<0:7> and DATA_MSK_PD3<0:7>, and the data masking signals DATA_MASK_SIG2<4:7> and DATA_MASK_SIG2<12:15> among the second data masking signals DATA_MASK_SIG2<0:15> are used to determine the logic levels of the pad masking signals DATA_MSK_PD3<0:7> among the second pad masking signals DATA_MSK_PD1<0:7> and DATA_MSK_PD3<0:7>.

At this time, the first pad masking signals DATA_MSK_PD0<0:7> and DATA_MSK_PD2<0:7> are used to control the data inputted through the data pads DQ PAD<0:7> and DQ PAD<16:23> among the plurality of data pads DQ PAD<0:31> to be masked on a byte-by-byte basis, and the second pad masking signals DATA_MSK_PD1<0:7> and DATA_MSK_PD3<0:7> are used to control the data inputted through the data pads DQ PAD<8:15> and DQ PAD<24:31> among the plurality of data pads DQ PAD<0:31> to be masked on the byte-by-byte basis.

In response to the enabled double data masking entry signal CASP_WDM_SIG of the data masking entry signals CASP_WDM_SIG and CASP_WSM_SIG outputted from the mode entry controlling unit 300, the signal classifying unit 320 recognizes the signals inputted sequentially and in parallel through the plurality of address pads ADDRESS PAD<0:11> and BANK ADDRESS PAD<0:3> as the column address signals COLUMN ADDRESS<0:6> in a first clock cycle CLK and CLK# of two clock cycles 2tck and as the data masking signals DATA_MASK_SIG<0:15> in a second clock cycle CLK and CLK# of the two clock cycles 2tck.

Herein, a point of time where the signals are inputted sequentially and in parallel through the plurality of address pads ADDRESS PAD<0:11> and BANK ADDRESS PAD<0:3> and a point of time where the signal classifying unit 320 recognizes the column address signals COLUMN ADDRESS<0:6> or the data masking signals DATA_MASK_SIG<0:15> and outputs them, are changed according to the write latency signals WR_LATENCY<1:7>.

This will be described again when explaining the detailed circuit of the signal classifying unit 320.

The signal classifying unit 320 recognizes the signals inputted sequentially and in parallel through the plurality of address pads ADDRESS PAD<0:11> and BANK ADDRESS PAD<0:3> on the basis of the two clock cycles 2tck means that, in a state of entering the data masking mode where the double data masking entry signal CASP_WDM_SIG of the data masking entry signals CASP_WDM_SIG and CASP_WSM_SIG is enabled, and the signals inputted sequentially and parallel through the plurality of address pads ADDRESS PAD<0:11> and BANK ADDRESS PAD<0:3> repeatedly become the column address signals COLUMN ADDRESS<0:6> and the data masking signals DATA_MASK_SIG<0:15> for every two clock cycles 2tck.

While the column address signals COLUMN ADDRSS<0:6> are outputted from the signal classifying unit 320 and inputted to the address decoder to be transferred to the plurality of banks BANK 0, BANK 1, BANK 2 and BANK 3 that are the core range, the data masking signals DATA_MASK_SIG<0:15> are inputted to the pad masking signal generating unit 340 and used to determine the logic levels of the plurality of pad masking signals DATA_MSK_PD0<0:7>, DATA_MSK_PD1<0:7>, DATA_MSK_PD2<0:7> and DATA_MSK_PD3<0:7>.

In particular, in response to the enabled double data masking entry signal CASP_WDM_SIG of the data masking entry signals CASP_WDM_SIG and CASP_WSM_SIG, the pad masking signal generating unit 340 coverts and outputs the data masking signals DATA_MASK_SIG<0:15> to the pad masking signals DATA_MSK_PD0<0:7>, DATA_MSK_PD2<0:7>, DATA_MSK_PD1<0:7> and DATA_MSK_PD3<0:7>.

That is, the data masking signals DATA_MASK_SIG<0:3> and DATA_MASK_SIG<8:11> among the data masking signals DATA_MASK_SIG<0:15> are used to determine the logic levels of the pad masking signals DATA_MSK_PD0<0:7> and DATA_MSK_PD1<0:7> among the pad masking signals DATA_MSK_PD0<0:7>, DATA_MSK_PD1<0:7>, DATA_MSK_PD2<0:7> and DATA_MSK_PD3<0:7>, and the data masking signals DATA_MASK_SIG<4:7> and DATA_MASK_SIG<12:15> among the data masking signals DATA_MASK_SIG<0:15> are used to determine the logic levels of the pad masking signals DATA_MSK_PD2<0:7> and DATA_MSK_PD3<0:7> among the pad masking signals DATA_MSK_PD0<0:7>, DATA_MSK_PD1<0:7>, DATA_MSK_PD2<0:7> and DATA_MSK_PD3<0:7>.

At this time, the pad masking signals DATA_MSK_PD0<0:7>, DATA_MSK_PD1<0:7>, DATA_MSK_PD2<0:7> and DATA_MSK_PD3<0:7> are used to control the data inputted through the plurality of data pads DQ PAD<0:31> to be masked on a byte-by-byte basis.

Figure 4A:
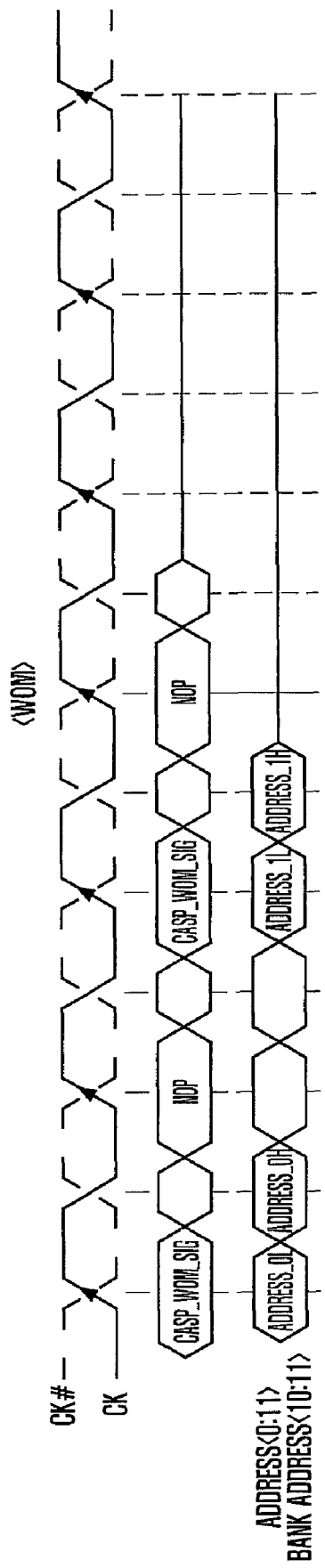
FIGS. 4A to 4C illustrate timing diagrams of explaining an operation of the data mask circuit described in FIG. 3.
Figure 4B:
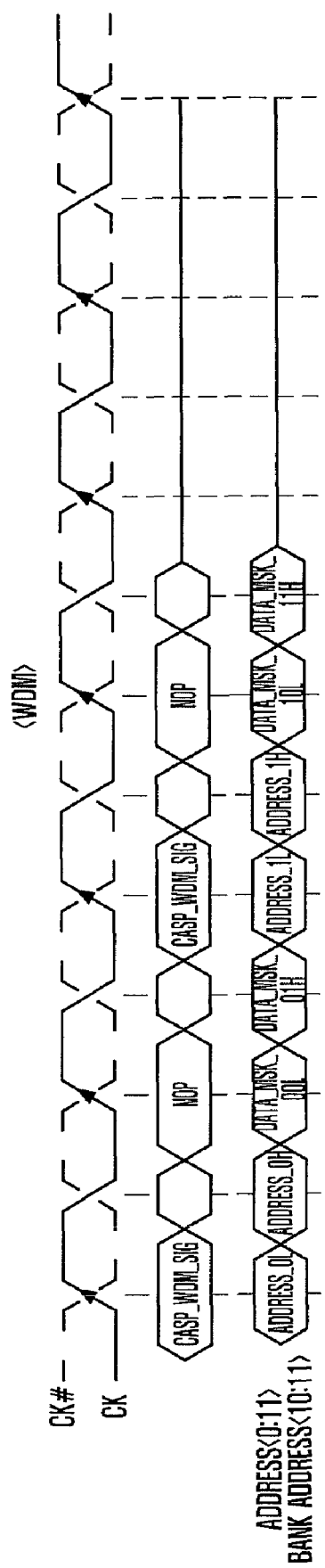
Figure 4C:
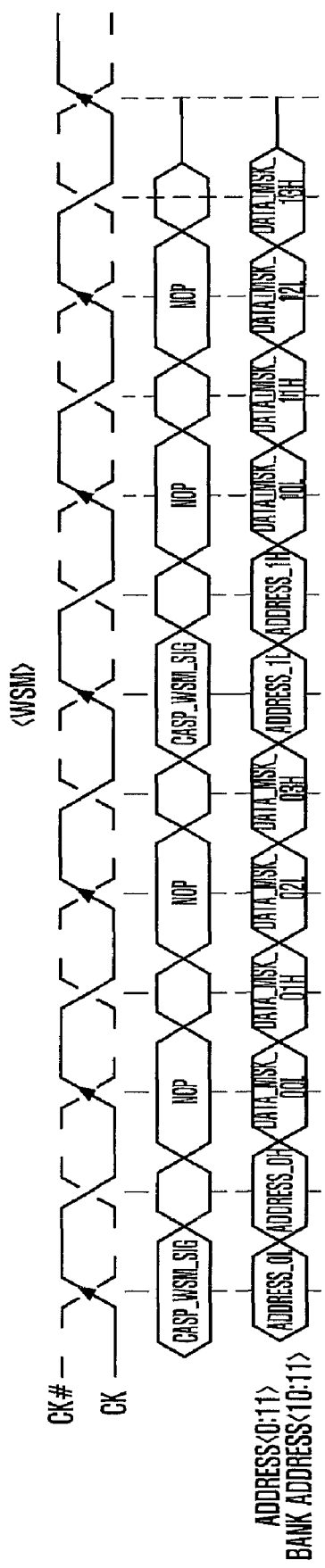

FIGS. 4A to 4C illustrate timing diagrams of explaining an operation of the data mask circuit that is employed to perform the data masking operation in accordance with the embodiment of the present invention described in FIGS. 2 and 3.

Referring to FIGS. 4A to 4C, it is noted that the data mask circuit employed to perform the data masking operation in accordance with an embodiment of the present invention determines, in a state of the write command signal WR_COMMAND being enabled and at a rising edge of a first period of clocks CLK and CLK#, entry or not to the data masking mode or a kind of the data masking mode in response to signals inputted through the predetermined pads ADDRESS PAD<10:11> among address signals ADDRESSS_0L inputted through the plurality of address pads ADDRESS PAD<0:11> and BNAK ADDRESS PAD<0:3>, and sequentially receives the column address signals COLUMN ADDRESS<0:6> and the data masking signals DATA_MASK_SIG<0:15> according to an expected rule.

In particular, in the first timing diagram "WOM" described in FIG. 4A, since the data masking mode out signal CASP_WOM_SIG is enabled in response to the signals inputted through the predetermined pads ADDRESS PAD<10:11> among the address signals ADDRESS_0L inputted through the plurality of address pads ADDRESS PAD<0:11> and BANK ADDRESS PAD<0:3> at the rising edge of the first period of the clocks CLK and CLK#, the semiconductor memory device does not enter the data masking mode. Thus, it is noted that address signals ADDRSS_0H are inputted at a falling edge of the first period of the clocks CLK and CLK# and meaningless signals are inputted through the plurality of address pads ADDRESS PAD<0:11> and BANK ADDRESS PAD<0:3> at a rising edge and a falling edge of a second period of the clocks CLK and CLK#. At this time, the meaningless signals may mean that there is no signal inputted.

When the second period of the clocks CLK and CLK# is terminated and a third period thereof starts, address signals ADDRESS_1L are inputted through the plurality of address pads ADDRESS PAD<0:11> and BANK ADDRESS PAD<0:3> and then the above described operation is repeatedly performed.

In the second timing diagram "WDM" described in FIG. 4B, since the double data masking entry signal CASP_WDM_SIG of the data masking entry signals CASP_WDM_SIG and CASP_WSM_SIG is enabled in response to the signals inputted through the predetermined pads ADDRESS PAD<10:11> among the address signals ADDRESS_0L inputted through the plurality of address pads ADDRESS PAD<0:11> and BANK ADDRESS PAD<0:3> at the rising edge of the first period of the clocks CLK and CLK#, the semiconductor memory device enters the double data masking mode among data masking modes. Thus, it is noted that address signals ADDRSS_0H are inputted at the falling edge of the first period of the clocks CLK and CLK# and the data masking signals DATA_MASK_SIG<0:15> are divided into equal halves, i.e., DATA_MSK_00L and DATA_MSK_01H, and inputted through the plurality of address pads ADDRESS PAD<0:11> and BANK ADDRESS PAD<0:3> at the rising edge and the falling edge of the second period of the clocks CLK and CLK#.

When the second period of the clocks CLK and CLK# is terminated and a third period thereof starts, address signals ADDRESS_1L are inputted through the plurality of address pads ADDRESS PAD<0:11> and BANK ADDRESS PAD<0:3>. When the third period of the clocks CLK and CLK# is terminated and a fourth period thereof starts, the data masking signals DATA_MASK_SIG<0:15> are inputted through the plurality of address pads ADDRESS PAD<0:11> and BANK ADDRESS PAD<0:3> and then the above described operation is repeatedly performed.

In the third timing diagram "WSM" described in FIG. 4C, since the single data masking entry signal CASP_WSM_SIG of the data masking entry signals CASP_WDM_SIG and CASP_WSM_SIG is enabled in response to the signals inputted through the predetermined pads ADDRESS PAD<10:11> among the address signals ADDRESS_0L inputted through the plurality of address pads ADDRESS PAD<0:11> and BANK ADDRESS PAD<0:3> at the rising edge of the first period of the clocks CLK and CLK#, the semiconductor memory device enters the single data masking mode among the data masking modes. Thus, it is noted that address signals ADDRSS_0H are inputted at the falling edge of the first period of the clocks CLK and CLK#; the first data masking signals DATA_MASK_SIG1<0:15> are divided into equal halves, i.e., DATA_MSK_00L and DATA_MSK_01H, and inputted through the plurality of address pads ADDRESS PAD<0:11> and BANK ADDRESS PAD<0:3> at the rising edge and the falling edge of the second period of the clocks CLK and CLK#; and the second data masking signals DATA_MASK_SIG2<0:15> are divided into equal halves, i.e., DATA_MSK_02L and DATA_MSK_03H, and inputted through the plurality of address pads ADDRESS PAD<0:11> and BANK ADDRESS PAD<0:3> at a rising edge and a falling edge of the third period of the clocks CLK and CLK#.

When the third period of the clocks CLK and CLK# is terminated and the fourth period thereof starts, address signals ADDRESS_1L and ADDRESS_1H are inputted through the plurality of address pads ADDRESS PAD<0:11> and BANK ADDRESS PAD<0:3>. When the fourth period of the clocks CLK and CLK# is terminated and a fifth period thereof starts, the first data masking signals DATA_MASK_SIG1<0:15>, i.e., DATA_MSK_10L and DATA_MSK_11H, are inputted through the plurality of address pads ADDRESS PAD<0:11> and BANK ADDRESS PAD<0:3> and then the above described operation is repeatedly performed.

Figure 5:
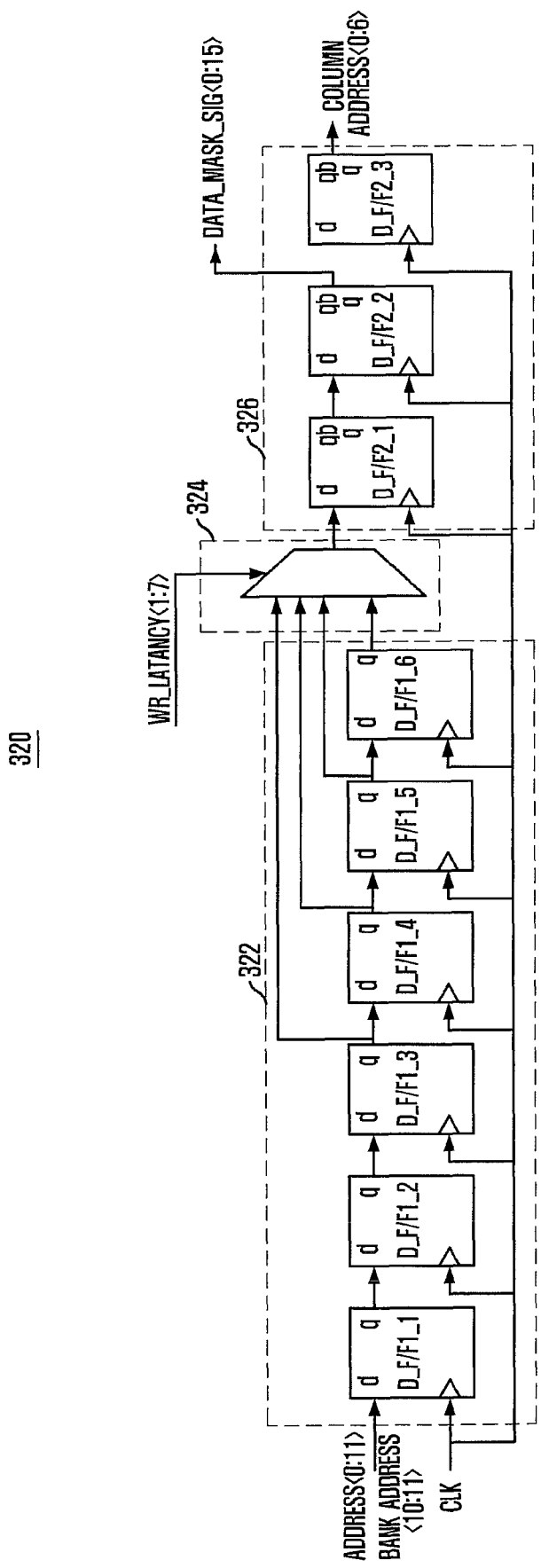
FIG. 5 illustrates a detailed circuit diagram of a signal classifying unit included in the data mask circuit described in FIG. 3.

FIG. 5 illustrates a detailed circuit diagram of the signal classifying unit 320 included in the data mask circuit described in FIG. 3.

As shown, in response to the write latency signals WR_LATENCY<1:7> whose value is determined according to write latency WL whose values are predetermined at a memory register set (MRS) of the semiconductor memory device, the signal classifying unit 320 can adjust a point of time of outputting the signals ADDRESS<0:11> and BANK ADDRESS<0:3> inputted through the plurality of address pads ADDRESS PAD<0:11> and BANK ADDRESS PAD<0:3> and determine how to classify the signals.

In particular, the signal classifying unit 320 includes a signal transfer sector 322, a multiplexer 324 and a signal output sector 326.

The signal transfer sector 322 includes a plurality of first flip-flops D_F/F1_1, D_F/F1_2, D_F/F1_3, D_F/F1_4, D_F/F1_5 and D_F/F1_6 that are connected in series to construct a chain, transfers the signals ADDRESS<0:11> and BANK ADDRESS<0:3> inputted through the plurality of address pads ADDRESS PAD<0:11> and BANK ADDRESS PAD<0:3> in a first-in first-out (FIFO) manner according to the toggling of the clocks CLK and CLK#, and outputs signals outputted from the plurality of first flip-flops D_F/F1_1, D_F/F1_2, D_F/F1_3, D_F/F1_4, D_F/F1_5 and D_F/F1_6 whenever the clocks CLK and CLK# are toggled.

The multiplexer 324 selects and outputs one of the signals outputted from the plurality of first flip-flops D_F/F1_1, D_F/F1_2, D_F/F1_3, D_F/F1_4, D_F/F1_5 and D_F/F1_6 of the signal transfer sector 322 in response to the write latency signals WR_LATENCY<1:7>.

The signal output sector 326 includes a plurality of second flip-flops D_F/F2_1, D_F/F2_2 and D_F/F2_3 that are connected in series to construct a chain, transfers an output signal of the multiplexer 324 in the FIFO manner, and outputs signals outputted from the flip-flops D_F/F2_2 and D_F/F2_3 among the plurality of second flip-flops D_F/F2_1, D_F/F2_2 and D_F/F2_3 as the data masking signals DATA_MASK_SIG<0:15> and the column address signals COLUMN ADDRESS<0:6>, respectively.

Since a point of time where the signal transfer sector 322 transfers the address signals ADDRESS<0:11> and BANK ADDRESS<0:3> inputted through the plurality of address pads ADDRESS PAD<0:11> and BANK ADDRESS PAD<0:3> to the signal output sector 326 is changed according to the write latency signals WR_LATENCY<1:7> applied through the multiplexer 324, the signal classifying unit 320 can adjust the point of time where the signals inputted through the plurality of address pads ADDRESS PAD<0:11> and BANK ADDRESS PAD<0:3> are outputted as the column address signals COLUMN ADDRESS<0:6> or the data masking signals DATA_MASK_SIG<0:15> in response to the write latency signals WR_LATENCY<1:7>.

Namely, since the plurality of first flip-flops D_F/F1_1, D_F/F1_2, D_F/F1_3, D_F/F1_4, D_F/F1_5 and D_F/F1_6 of the signal transfer sector 322 transfers the signals ADDRESS<0:11> and BANK ADDRESS<0:3> inputted through the plurality of address pads ADDRESS PAD<0:11> and BANK ADDRESS PAD<0:3> in the FIFO manner in response to the toggling of the clocks CLK and CLK#, the address signals ADDRESS<0:11> and BANK ADDRESS<0:3> sequentially pass through the plurality of first flip-flops D_F/F1_1, D_F/F1_2, D_F/F1_3, D_F/F1_4, D_F/F1_5 and D_F/F1_6 whenever the clocks CLK and CLK# are toggled. At this time, since the multiplexer 324 selects and outputs one of the signals outputted from the plurality of first flip-flops D_F/F1_1, D_F/F1_2, D_F/F1_3, D_F/F1_4, D_F/F1_5 and D_F/F1_6 according to the values of the write latency signals WR_LATENCY<1:7>, the toggling times of the clocks CLK and CLK# required until the signals ADDRESS<0:11> and BANK ADDRESS<0:3> inputted through the plurality of address pads ADDRESS PAD<0:11> and BANK ADDRESS PAD<0:3> are outputted as the output signals of the multiplexer 324 is changed according to the values of the write latency signals WR_LATENCY<1:7>. Therefore, although the signals ADDRESS<0:11> and BANK ADDRESS<0:3> are inputted through the plurality of address pads ADDRESS PAD<0:11> and BANK ADDRESS PAD<0:3> at the same point of time, their points of time where they are transferred to the signal output sector 326 may be changed according to the values of the write latency signals WR_LATENCY<1:7>.

For instance, if a value of the write latency WL that is defined by the values of the write latency signals WR_LATENCY<1:7> is 3, the multiplexer 324 receives signals outputted from the third flip-flop DF/F1_3 among the plurality of first flip-flops D_F/F1_1, D_F/F1_2, D_F/F1_3, D_F/F1_4, D_F/F1_5 and D_F/F1_6 and outputs the received signals. Therefore, the address signals ADDRESS<0:11> and BANK ADDRESS<0:3> inputted through the plurality of address pads ADDRESS PAD<0:11> and BANK ADDRESS PAD<0:3> should wait for 3 times of toggling of the clocks CLK and CLK# until they are transferred to the third flip-flop D_F/F1_3 and then can be transferred to the signal output sector 326 as the output signals of the multiplexer 324.

Meanwhile, if a value of the write latency WL that is defined by the values of the write latency signals WR_LATENCY<1:7> is 5, the multiplexer 324 receives signals outputted from the fifth flip-flop DF/F1_5 among the plurality of first flip-flops D_F/F1_1, D_F/F1_2, D_F/F1_3, D_F/F1_4, D_F/F1_5 and D_F/F1_6 and outputs the received signals. Therefore, the address signals ADDRESS<0:11> and BANK ADDRESS<0:3> inputted through the plurality of address pads ADDRESS PAD<0:11> and BANK ADDRESS PAD<0:3> should wait 5 toggles of the clocks CLK and CLK# until they are transferred to the fifth flip-flop D_F/F1_5 and then can be transferred to the signal output sector 326 as the output signals of the multiplexer 324.

Conclusively, the signal transfer sector 322 and the multiplexer 324 can change the point of time where the signals ADDRESS<0:11> and BANK ADDRESS<0:3> inputted through the plurality of address pads ADDRESS PAD<0:11> and BANK ADDRESS PAD<0:3> are transferred to the signal output sector 326 according to the values of the write latency signals WR_LATENCY<1:7>.

Furthermore, since the signal output sector 326 included in the signal classifying unit 320 outputs the data masking signals DATA_MASK_SIG<0:15> and the column address signals COLUMN ADDRESS<0:6> through the flip-flops D_F/F2_2 and D_F/F2_3 among the plurality of second flip-flops D_F/F2_1, D_F/F2_2 and D_F/F2_3, the signal classifying unit 320 can classify the signals ADDRESS<0:11> and BANK ADDRESS<0:3> inputted through the plurality of address pads ADDRESS PAD<0:11> and BANK ADDRESS PAD<0:3> into the column address signals COLUMN ADDRESS<0:6> and the data masking signals DATA_MASK_SIG<0:15> according to the write latency signals WR_LATENCY<1:7>.

That is, the signals outputted from the multiplexer 324 are the address signals ADDRESS<0:11> and BANK ADDRESS<0:3> inputted through the plurality of address pads ADDRESS PAD<0:11> and BANK ADDRESS PAD<0:3> that are outputted at it is at the point of time corresponding to the write latency signals WR_LATENCY<1:7>. Thus, since all of the plurality of second flip-flops D_F/F2_1, D_F/F2_2 and D_F/F2_3 receiving the signals outputted from the multiplexer 324 and transferring the received signals in the FIFO manner output the received signals in response to the toggling of the clocks CLK and CLK#, when first and foremost inputted signals from the multiplexer 324 arrive at the last flip-flop D_F/F2_3 among the plurality of second flip-flops D_F/F2_1, D_F/F2_2 and D_F/F2_3 and are outputted, secondly inputted signals from the multiplexer 324 may arrive at the second flip-flop D_F/F2_2 among the plurality of second flip-flops D_F/F2_1, D_F/F2_2 and D_F/F2_3 and be outputted.

At this time, since the first and foremost inputted signals among the signals ADDRESS<0:11> and BANK ADDRESS<0:3> inputted through the plurality of address pads ADDRESS PAD<0:11> and BANK ADDRESS PAD<0:3> are the column address signals COLUMN ADDRESS<0:6> and the secondly inputted signals thereof are the data masking signals DATA_MASK_SIG<0:15>, the first and foremost inputted signals from the multiplexer 324 become the column address signals COLUMN ADDRESS<0:6> and the secondly inputted signals from the multiplexer 324 become the data masking signals DATA_MASK_SIG<0:15>. Therefore, the signals arriving at the last flip-flop D_F/F2_3 and outputted become the column address signals COLUMN ADDRESS<0:6> and the signals arriving at the flip-flop D_F/F2_2 and outputted become the data masking signals DATA_MASK_SIG<0:15>.

Finally, although signals are inputted as the column address signals COLUMN ADDRESS<0:6> and the data masking signals DATA_MASK_SIG<0:15> at different points of time through the plurality of address pads ADDRESS PAD<0:11> and BANK ADDRESS PAD<0:3>, it is possible to determine which signals are the column address signals COLUMN ADDRESS<0:6> and which signals are the data masking signals DATA_MASK_SIG<0:15> at the same point of time through signals output sector 324 of the signal classifying unit 320.

As described above, in accordance with the embodiment of the present invention, by receiving the data masking signals DATA_MASK_SIG<0:15> through the address pads ADDRESS PAD<0:11> and BANK ADDRESS PAS<0:3> for receiving the row address signals ROW ADDRESS<0:11> and the column address signals COLUMN ADDRESS<0:6>, it is possible to perform the data masking operation without employing separate pads only for receiving the data masking signals, DATA_MASK_SIG<0:15> in the semiconductor memory device.

That is, in accordance with the embodiment of the present invention, it is possible to perform the data masking operation without employing pads only for the data masking signals by receiving the data masking signals together with the address signals through the pads where the address signals are inputted.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a plurality of address pads;
   a plurality of data pads;
   a mode entry controlling unit configured to control an entry to a data masking mode in response to a write command signal and signals inputted through predetermined pads of the plurality of address pads;
   a signal classifying unit configured to classify signals inputted sequentially and in parallel through the plurality of address pads into column address signals and data masking signals in response to an output signal of the mode entry controlling unit and a write latency signal; and
   a pad masking signal generating unit configured to generate pad masking signals to control the masking of data inputted through the plurality of data pads, wherein the pad masking signals are generated by converting the data masking signals in response to the output signal of the mode entry controlling unit.

2. The semiconductor memory device of claim 1, further comprising:
   a core range including a plurality of cells; and
   a peripheral range configured to perform an operation of writing the data inputted through the plurality of data pads in a cell corresponding to the column address signals among the plurality of cells.

3. The semiconductor memory device of claim 1, wherein the mode entry controlling unit is configured to output an enabled data masking mode out signal when all of the signals inputted through the predetermined pads are disabled in a period that the write command signal is enabled to avoid entering of the data masking mode by the semiconductor memory device.

4. The semiconductor memory device of claim 3, wherein the signal classifying unit classifies the signals inputted sequentially and in parallel through the plurality of address pads into column address signals at a point of time corresponding to the write latency signal based on two clocks in response to the enabled data masking mode out signal.

5. The semiconductor memory device of claim 4, wherein the pad masking signal generating unit disables the pad masking signals regardless of signals outputted from the signal classifying unit in response to the enabled data masking mode out signal to avoid masking of the data inputted through the plurality of data pads.

6. The semiconductor memory device of claim 3, wherein the mode entry controlling unit outputs a disabled data masking mode out signal when at least one of the signals inputted through the preset pads is enabled during the period where the write command signal is enabled to allow the semiconductor memory device to enter the data masking mode, and determines a type of the data masking mode by enabling one of a plurality of data masking entry signals according to a number of enabled signals among the signals inputted through the predetermined pads.

7. The semiconductor memory device of claim 6, wherein the plurality of data masking entry signals includes a single data masking entry signal and a double data masking entry signal.

8. The semiconductor memory device of claim 7, wherein the signal classifying unit classifies the signals inputted sequentially and in parallel through the plurality of address pads into the column address signals, first data masking signals and second data masking signals at a point of time corresponding to the write latency signal based on three clocks in response to an enabled single data masking entry signal.

9. The semiconductor memory device of claim 8, wherein the pad masking signal generating unit converts the first data masking signals and the second data masking signals to first pad masking signals and second pad masking signals, respectively, in response to the enabled single data masking entry signal and outputs the first pad masking signals and the second pad masking signals, wherein the first pad masking signals are used to control the masking of data inputted through predetermined pads that are half of the plurality of data pads and the second pad masking signals are used to control data inputted through the remaining pads among the plurality of data pads to be masked on a byte-by-byte basis.

10. The semiconductor memory device of claim 7, wherein the signal classifying unit is configured to classify the signals inputted sequentially and in parallel through the plurality of address pads into the column address signals and the data masking signals at a point of time corresponding to the write latency signal based on two clocks in response to an enabled double data masking entry signal.

11. The semiconductor memory device of claim 10, wherein the pad masking signal generating unit is configured to convert the data masking signals to the pad masking signals in response to the enabled single data masking entry signal and output the pad masking signals, wherein the pad masking signals are used to control the data inputted through the plurality of data pads to be masked on a byte-by-byte basis.

* * * * *